United States Patent [19]

Toukhy

[11] Patent Number: 5,338,653
[45] Date of Patent: Aug. 16, 1994

[54] PHENOLIC NOVOLAK RESIN COMPOSITIONS CONTAINING 5-INDANOL AND THEIR USE A PROCESS FOR FORMING POSITIVE RESIST PATTERNS

[75] Inventor: Medhat A. Toukhy, Barrington, R.I.

[73] Assignee: OCG Microelectronic Materials, Inc., West Paterson, N.J.

[21] Appl. No.: 194,193

[22] Filed: Feb. 9, 1994

Related U.S. Application Data

[62] Division of Ser. No. 122,953, Sep. 20, 1993, which is a division of Ser. No. 21,634, Feb. 22, 1993, Pat. No. 5,250,653.

[51] Int. Cl.$^5$ .......................... G03F 7/30; G03F 7/023
[52] U.S. Cl. ..................................... 430/326; 430/165; 430/191; 430/192; 430/193
[58] Field of Search ............... 430/326, 191, 192, 193, 430/165

[56] References Cited

U.S. PATENT DOCUMENTS

| | | | |
|---|---|---|---|
| 3,442,893 | 6/1969 | Lynch | 546/343 |
| 3,716,359 | 6/1974 | Hall | 430/19 |
| 3,759,898 | 9/1973 | Nakanishi | 540/318 |
| 3,832,381 | 8/1974 | Taylor et al. | 560/122 |
| 3,876,562 | 4/1975 | Hall | 512/13 |
| 3,985,930 | 10/1976 | Shackle | 503/222 |
| 4,366,328 | 12/1992 | Numata et al. | 568/734 |
| 4,418,220 | 11/1983 | Numata et al. | 568/734 |
| 4,920,028 | 4/1990 | Lazarus et al. | 430/192 |
| 4,943,511 | 7/1990 | Lazarus et al. | 430/192 |
| 4,948,864 | 8/1990 | Imai et al. | 528/219 |
| 5,250,653 | 10/1993 | Toukhy | 430/192 |

FOREIGN PATENT DOCUMENTS

| | | |
|---|---|---|
| 61148401 | 7/1981 | Japan . |
| 61-159420 | 7/1986 | Japan . |
| 61-159421 | 7/1986 | Japan . |
| 1420730 | 1/1976 | United Kingdom . |
| 2011399 | 7/1979 | United Kingdom . |

OTHER PUBLICATIONS

CA75(2):6802h–Antioxidants & Stabilizers (1990 American Chemical Society).
CA70(24):107209x–Use of Porapak type Czechoslovakian Organic Polymer in Thin-Layer (1990 American Chemical Society).
CA68(20):92769n–Application of Porous Ethylvinylbenzene Polymers to Thin-Layer Chromatography (1990 American Chemical Society).

*Primary Examiner*—Charles L. Bowers, Jr.
*Assistant Examiner*—John S. Chu
*Attorney, Agent, or Firm*—William A. Simons

[57] ABSTRACT

A phenolic novolak resin composition comprising a condensation product of at least one aldehyde source with a phenolic source comprising 5-indanol. Said phenolic novolak resins are used in radiation-sensitive compositions, especially those useful as positive-working photoresists.

4 Claims, No Drawings

PHENOLIC NOVOLAK RESIN COMPOSITIONS CONTAINING 5-INDANOL AND THEIR USE A PROCESS FOR FORMING POSITIVE RESIST PATTERNS

This application is a division of U.S. application Ser. No. 08/122,953 filed Sep. 20, 1993, now allowed, which is a divisional of U.S. application Ser. No. 08/021,634 filed Feb. 22, 1993, now U.S. Pat. No. 5,250,653, both of which are incorporated herein by reference in their entirety.

BACKGROUND OF THE INVENTION

1. Field of the Invention

The present invention relates to selected phenolic novolak resins made from 5-indanol. Furthermore, the present invention relates to radiation-sensitive compositions useful as positiveworking photoresist compositions, particularly, those containing these phenolic novolak resins and o-quinonediazide photosensitizers. Still further, the present invention also relates to substrates coated with these radiation-sensitive compositions as well as the process of coating, imaging and developing these radiationsensitive mixtures on these substrates.

2. Description of Related Art

Photoresist compositions are used in microlithographic processes for making miniaturized electronic components such as in the fabrication of integrated circuits and printed wiring board circuitry. Generally, in these processes, a thin coating or film of a photoresist composition is first applied to a substrate material, such as silicon wafers used for making integrated circuits or aluminum or copper plates of printed wiring boards. The coated substrate is then baked to evaporate any solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions—negative-working and positive-working. When negative-working photoresist compositions are exposed image-wise to radiation, the areas of the resist composition exposed to the radiation become less soluble to a developer solution (e.g., a cross-linking reaction occurs) while the unexposed areas of the photoresist coating remain relatively soluble to a developing solution. Thus, treatment of an exposed negative-working resist with a developer solution causes removal of the nonexposed areas of the resist coating and the creation of a negative image in the photoresist coating, and thereby uncovering a desired portion of the underlying substrate surface on which the photoresist composition was deposited. On the other hand, when positive-working photoresist compositions are exposed image-wise to radiation, those areas of the resist composition exposed to the radiation become more soluble to the developer solution (e.g., a rearrangement reaction occurs) while those areas not exposed remain relatively insoluble to the developer solution. Thus, treatment of an exposed positive-working resist with the developer solution causes removal of the exposed areas of the resist coating and the creation of a positive image in the photoresist coating. Again, a desired portion of the underlying substrate surface is uncovered.

After this development operation, the now partially unprotected substrate may be treated with a substrate-etchant solution or plasma gases and the like. This etchant solution or plasma gases etch the portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining resist layer after the development step and before the etching step to increase its adhesion to the underlying substrate and its resistance to etching solutions.

Positive-working photoresists are generally prepared by blending a suitable alkali-soluble binder resin (e.g., a phenolic-formaldehyde novolak resin) with a photoactive compound (PAC) which converts from being insoluble to soluble in an alkaline aqueous developer solution after exposure to a light or energy source. The most common class of PAC's employed today for positive-working resists are quinone diazide esters of a polyhydroxy compound. Typical novolak resins used today for positive-working resins are made from various mixtures of ortho-cresol, meta-cresol, and para-cresol which are condensed with an aldehyde source (e.g., formaldehyde).

Positive-working photoresist compositions are currently favored over negative-working resists because the former generally have better resolution capabilities and pattern transfer characteristics.

Photoresist resolution is defined as the smallest feature which the resist composition can transfer from the photomask to the substrate with a high degree of image edge acuity after exposure and development. In many manufacturing applications today, resist resolution on the order of one micron or less are necessary.

In addition, it is generally desirable that the developed photoresist wall profiles be near vertical relative to the substrate. Such demarcations between developed and undeveloped areas of the resist coating translate into accurate pattern transfer of the mask image onto the substrate.

Increased resolution has been noted in positive photoresist systems whose novolaks possess a high degree of ortho-, ortho-bonding. The term ortho-, ortho-bonding is used to refer to the location and positions of attachment of the methylene bridge between phenolic nuclei. Thus, the methylene bridge which connects two phenolic nuclei which is ortho to both phenolic hydroxyl groups is regarded as ortho, ortho.

It is thought that ortho, ortho-bonding increases the interactions between phenolic hydroxyls in the novolak and the photoactive compound in positive photoresists compared to positive photoresists containing novolaks which lack a high degree of ortho, ortho-bonding in their micro-structure. Although the exact character of these interactions is speculative, e.g., hydrogen bonding, van der Waals forces, and the like, there is a correlation between increased resolution and contrast observed in these positive resists whose novolaks contain a high degree of ortho-, ortho-bonding compared to positive resists whose novolaks lack this high degree of ortho-, ortho-bonding.

The optimum number of ortho, ortho-bonds necessary for optimum interaction between the PAC and the novolak not known. However, it is noted that novolak resins which have a very high percentage of ortho-, ortho-bonding (e.g., a very high content of para-cresol in the novolak) appear to result in photoresists having scum (i.e., undesired residues in the exposed and unexposed areas). Accordingly, having the optimum number of ortho, ortho bonds distributed properly may minimize or eliminate this scum problem.

U.S. Pat. application Ser. No. 07/713,891, entitled "Radiation-Sensitive Compositions Containing Fully Substituted Novolak Polymers" filed the same day as the parent of this application and assigned to the same assignee, is directed to making and using novolak resins containing a mixture of selected monofunctional and difunctional phenolic monomers with controlled ortho-, ortho-bonding. That U.S. Patent Application is incorporated herein by reference in its entirety. 5-Indanol is one species of one particular class of difunctional phenolic monomers disclosed in that U.S. Patent Application. Besides being useful in making those particular fully substituted novolak resins, it is believed that 5-indanol may be useful in making other novolak resins which are also useful in radiation-sensitive compositions- Thus, the present invention is directed to making novolak resins in general from 5-indanol.

SUMMARY OF THE INVENTION

Accordingly, the present invention is directed to a phenolic novolak resin composition comprising a condensation product of at least one aldehyde source with a phenolic source comprising 5-indanol.

Moreover, the present invention is directed to a radiation-sensitive composition useful as a positive photoresist comprising an admixture of o-quinonediazide compound and binder resin comprising a condensation product of at least one aldehyde source with a phenolic source comprising 5-indanol. The amount of said o-quinonediazide compound or compounds being about 5% to about 40% by weight and the amount of said binder resin being about 60% to 95% by weight, based on the total solid content of said radiation-sensitive composition.

Still further, the present invention also encompasses the process of coating substrates with these radiation-sensitive compositions and then imaging and developing these coated substrates.

Also further, the present invention encompasses said coated substrates (both before and after imaging) as novel articles of manufacture.

DETAILED DESCRIPTION

The phenolic resins of the present invention are made by reacting an aldehyde source with 5-indanol alone or in combination with other phenolic moieties under usual novolak-making conditions. Any suitable aldehyde source may be used for this reaction. Examples of aldehyde sources include formaldehyde, acetoaldehyde, haloacetoaldehydes, benzoaldehydes, halobenzoaldehydes, and the like. 5-Indanol has the following chemical structure:

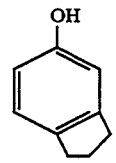

Other phenolic moieties include phenol, cresols, xylenols, trimethylphenols, and the like may be mixed with the 5-indanol.

Generally, this reaction occurs in the presence of an acid catalyst. Suitable acid catalysts include those commonly employed in acid condensation-type reactions such as HCl, $H_3PO_4$, $H_2SO_4$, oxalic acid, maleic acid, maleic anhydride, and organic sulfonic acids (e.g., p-toluene sulfonic acid). The most preferred acid catalyst is oxalic acid. Generally, it is also preferred to carry out the condensation reaction of compounds in the presence of an aqueous medium or an organic solvent. Suitable organic solvents include ethanol, tetrahydrofuran, cellosolve acetate, 1-methoxy-2-propanol and 2-ethoxy ethanol. Preferred solvents are water-soluble solvents such as ethanol, 1-methoxy-2-propanol and 2-ethoxy ethanol.

In making one preferred class of resins, the preferred precursors, namely, phenolic monomers (most preferably, a mixture of 5-indanol, meta-cresol and/or para-cresol), and formaldehyde are preferably placed in a reaction vessel. The reaction mixture usually also contains an acid catalyst and solvent as noted above. The mixture is then preferably heated to a temperature in the range from about 60° C. to about 120° C., more preferably from about 65° C. to about 95° C., for the novolak-forming condensation polymerization reaction to occur. If an aqueous medium is used instead of an organic solvent, the reaction temperature is usually maintained at reflux, e.g., about 90° to 100° C. The reaction time will depend on the specific reactants used and the ratio of formaldehyde to phenolic monomers. The mole ratio of formaldehyde to total phenolic moieties is generally less than about 1:1. Reaction times from 3 to 20 hours are generally suitable.

These preferred resins of the present invention preferably have a molecular weight of from about 500 to about 25,000, more preferably from about 750 to about 20,000. These preferred resins also have from about 0.1 to 100, more preferably about 5 to 60, mole percent of 5-indanol.

The 5-indanol containing resins of the present invention may be mixed with photoactive compounds to make radiation-sensitive mixtures which are useful as positive acting photoresists. The preferred class of photoactive compounds (sometimes called radiation sensitizers) is o-quinonediazide compounds particularly esters derived from polyhydric phenols, alkylpolyhydroxyphenones, aryl-polyhydroxyphenones, and the like which can contain up to six or more sites for esterification. The most preferred o-quinonediazide esters are derived from 2-diazo-1,2-dihydro-1-oxonaphthlene-4-sulfonic acid and 2-diazo-1,2-dihydro-1-oxo-naphthalene-5-sulfonic acid.

Specific examples include resorcinol 1,2-naphthoquinonediazide-4-sulfonic acid esters; pyrogallol 1,2-naphthoquinonediazide-5-sulfonic acid esters, 1,2-quinonediazidesulfonic acid esters of (poly)hydroxyphenyl alkyl ketones or (poly)hydroxyphenyl aryl ketones such as 2,4-dihydroxyphenyl propyl ketone 1,2-benzoquinonediazide-4-sulfonic acid esters, 2,4-dihydroxyphenyl hexyl ketone 1,2-naphthoquinonediazide-4-sulfonic acid esters, 2,4-dihydroxybenzophenone 1,2-naphthoquinonediazide-5-sulfonic acid esters, 2,3,4-trihydroxyphenyl hexyl ketone, 1,2-naphthoquinonediazide-4-sulfonic acid esters, 2,3,4-trihydroxybenzophenone 1,2-naphthoquinonediazide-4-sulfonic acid esters, 2,3,4-trihydroxybenzophenone 1,2-naphthoquinonediazide-5-sulfonic acid esters, 2,4,6-trihydroxybenzophenone 1,2-naphthoquinonediazide-4-sulfonic acid esters, 2,4,6-trihydroxybenzophenone 1,2-naphthoquinonediazide-5-sulfonic acid esters, 2,2',4,4'-tetrahydroxybenzophenone 1,2-naphthoquinonediazide-5-sulfonic acid esters, 2,3,4,4'-tetrahydroxybenzophenone 1,2-naphthoquinonediazide-5-sulfonic acid esters, 2',3',4',4'-tetrahydroxybenzophenone 1,2-naphthoquinone-diazide-4-sulfonic acid esters, 2,2',3,4',6'-pentahydroxybenzophenone 1,2-naphthoquinonediazide-5-sulfonic acid esters, and 2,3,3',4,4',5'-hexahydroxybenzophenone 1,2-naphthoquinonediazide-5-sulfonic acid esters; 1,2-quinonediazidesulfonic acid esters of bis[(poly)hydroxyphenyl]alkanes such as bis(p-hydroxyphenyl)methane 1,2-naphthoquinonediazide-4-sulfonic acid esters, bis(2,4-dihydroxyphenyl)methane 1,2-naphthoquinone-diazide-5-sulfonic acid esters, bis(2,3,4-trihydroxyphenyl)methane 1,2-naphthoquinonediazide-5-sulfonic acid esters, 2,2-bis(p-hydroxyphenyl)propane 1,2-naphthoquinonediazide-4-sulfonic acid esters, 2,2-bis(2,4-dihydroxyphenyl)propane 1,2-naphthoquinonediazide-5-sulfonic acid esters and 2,2-bis(2,3,4-trihydroxyphenyl)propane 1,2-naphthoquinonediazide-5-sulfonic acid esters. Besides the 1,2-quinonediazide compounds exemplified above, there can also be used the 1,2-quinonediazide compounds described in J. Kosar, "Light-Sensitive Systems", 339–352 (1965), John Wiley & Sons (New York) or in S. DeForest, "Photoresist", 50, (1975), MacGraw-Hill, Inc. (New York). In addition, these materials may be used in combinations of two or more. Further, mixtures of substances formed when less than all esterification sites present on a particular polyhydric phenol, alkylpolyhydroxyphenone, aryl-polyhydroxyphenone, and the like have combined with o-quinonediazides may be effectively utilized in positive acting photoresists.

Of all the 1,2-quinonediazide compounds mentioned above, 1,2-naphthoquinonediazide-5-sulfonic acid di-, tri-, tetra-, penta- and hexa-esters of polyhydroxy compounds having at least 2 hydroxyl groups, i.e., about 2 to 6 hydroxyl groups, are most preferred.

Among these most preferred 1,2-naphthoquinone5-diazide compounds are 2,3,4-trihydroxybenzophenone 1,2-naphthoquinonediazide-5-sulfonic acid esters, 2,3,4,4'-tetrahydroxybenzophenone 1,2-naphthoquinonediazide-5-sulfonic acid esters, and 2,2',4,4'-tetrahydroxybenzophenone 1,2-naphthoquinonediazide-5-sulfonic acid esters. These 1,2-quinonediazide compounds may be used alone or in combination of two or more.

The proportion of the radiation sensitizer compound in the radiation-sensitive mixture may preferably range from about 5 to about 40%, more preferably from about 10 to about 25% by weight of the nonvolatile (e.g., nonsolvent) content of the radiation-sensitive mixture. The proportion of total binder resin of this present invention in the radiation-sensitive mixture may preferably range from about 60% to about 95%, more preferably, from about 75 to 90% of the nonvolatile (e.g., excluding solvents) content of the radiation-sensitive mixture.

These radiation-sensitive mixtures may also contain conventional photoresist composition ingredients such as other resins, solvents, actinic and contrast dyes, anti-striation agents, plasticizers, speed enhancers, and the like. These additional ingredients may be added to the binder resin and sensitizer solution before the solution is coated onto the substrate.

Other binder resins may also be added beside the resins of the present invention mentioned above. Examples include phenolic-formaldehyde resins, cresol-formaldehyde resins, phenol-cresol-formaldehyde resins and polyvinylphenol resins commonly used in the photoresist art. If other binder resins are present, they will replace a portion of the binder resins of the present invention. Thus, the total amount of the binder resin in the radiation-sensitive composition will be from about 60% to about 95% by weight of the total nonvolatile solids content of the radiation-sensitive composition.

The resins and sensitizers may be dissolved in a solvent or solvents to facilitate their application to the substrate. Examples of suitable solvents include methoxyacetoxy propane, ethyl cellosolve acetate, n-butyl acetate, xylene, ethyl lactate, propylene glycol alkyl ether acetates, or mixtures thereof and the like. The preferred amount of solvent may be from about 50% to about 500%, or higher, by weight, more preferably, from about 100% to about 400% by weight, based on combined resin and sensitizer weight.

Actinic dyes help provide increased resolution on highly reflective surfaces by inhibiting back scattering of light off the substrate. This back scattering causes the undesirable effect of optical notching, especially on a substrate topography. Examples of actinic dyes include those that absorb light energy at approximately 400–460 nm [e.g., Fat Brown B (C.I. No. 12010); Fat Brown RR (C.I. No. 11285); 2-hydroxy-1,4-naphthoquinone (C.I. No. 75480) and Quinoline Yellow A (C.I. No. 47000)] and those that absorb light energy at approximately 300–340 nm [e.g., 2,5-diphenyloxazole (PPO-Chem. Abs. Reg. No. 92-71-7) and 2-(4-biphenyl)-6-phenyl-benzoxazole (PBBO-Chem. Abs. Reg. No. 17064-47-0)]. The amount of actinic dyes may be up to 10% weight levels, based on the combined weight of resin and sensitizer.

Contrast dyes enhance the visibility of the developed images and facilitate pattern alignment during manufacturing. Examples of contrast dye additives that may be used together with the radiation-sensitive mixtures of the present invention include Solvent Red 24 (C.I. No. 26105), Basic Fuchsin (C.I. 42514), Oil Blue N (C.I. No. 61555), and Calco Red A (C.I. No. 26125) up to 10% weight levels, based on the combined weight of resin and sensitizer.

Anti-striation agents level out the photoresist coating or film to a uniform thickness. Anti-striation agents may be used up to 5% weight levels, based on the combined weight of resin and sensitizer. One suitable class of anti-striation agents is nonionic silicon-modified polymers. One preferred one is TROYKYD 366 made by Troy Chemical Co. Schenectady, NY. Nonionic surfactants may also be used for this purpose, including, for example, nonylphenoxy poly(ethyleneoxy) ethanol; octylphenoxy (ethyleneoxy) ethanol; and dinonyl phenoxy poly(ethyleneoxy) ethanol.

Plasticizers improve the coating and adhesion properties of the photoresist composition and better allow for the application of a thin coating or film of photoresist which is smooth and of uniform thickness onto the substrate. Plasticizers which may be used include for example phosphoric acid tri-($\beta$-chloroethyl)-ester; stearic acid; dicamphor; polypropylene; acetal resins; phenoxy resins; and alkyl resins up to 10% weight levels, based on the combined weight of resin and sensitizer.

Speed enhancers tend to increase the solubility of the photoresist coating in both the exposed and unexposed areas, and thus, they are used in applications where speed of development is the overriding consideration even though some degree of contrast may be sacrificed, i.e., in positive resists while the exposed areas of the photoresist coating will be dissolved more quickly by the developer, the speed enhancers will also cause a larger loss of photoresist coating from the unexposed areas. Speed enhancers that may be used include, for example, picric acid, nicotinic acid or nitrocinnamic acid at weight levels of up to 20 percent, based on the combined weight of resin and sensitizer. A preferred speed enhancer is TRISP-PA which has the chemical names: 1-[1'-methyl-1'-(4'-hydroxyphenyl)ethyl]-4-[1',1'-bis-(4-hydroxy phenyl)ethyl] benzene or phenyl; 4,4'-[1-[4-[1-(4-hydroxyphenyl)1-methylethyl]phenyl]ethylidene]bis. TRISP-PA has a Chemical Abstract No. (CAS-110726-28-8).

The prepared radiation-sensitive resist mixture, can be applied to a substrate by any conventional method used in the photoresist art, including dipping, spraying, whirling and spin coating. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, aluminum or polymeric resins, silicon dioxide, doped silicon dioxide, silicon resins, gallium arsenide, silicon nitride, tantalum, copper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters and polyolefins.

After the resist solution is coated onto the substrate, the coated substrate is baked at approximately 70° to 125° C. until substantially all the solvent has evaporated and only a uniform radiation-sensitive coating remains on the substrate.

The coated substrate can then be exposed to radiation, especially ultraviolet radiation, in any desired exposure pattern, produced by use of suitable masks, negatives, stencils, templates, and the like. Conventional imaging process or apparatus currently used in processing photoresist-coated substrates may be employed with the present invention. In some instances, a post-exposure bake at a temperature about 10° C. higher than the soft bake temperature is used to enhance image quality and resolution.

The exposed resist-coated substrates are next developed in an aqueous alkaline developing solution. This solution is preferably agitated, for example, by nitrogen gas agitation. Examples of aqueous alkaline developers include aqueous solutions of tetramethylammonium hydroxide, sodium hydroxide, potassium hydroxide, ethanolamine, choline, sodium phosphates, sodium carbonate, sodium metasilicate, and the like. The preferred developers for this invention are aqueous solutions of either alkali metal hydroxides, phosphates or silicates, or mixtures thereof, or tetramethylammonium hydroxide (TMAH).

Alternative development techniques such as spray development or puddle development, or combinations thereof, may also be used.

The substrates are allowed to remain in the developer until all of the resist coating has dissolved from the exposed areas. Normally, development times from about 10 seconds to about 3 minutes are employed.

After selective dissolution of the coated wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature.

In industrial applications, particularly in the manufacture of microcircuitry units on silicon/silicon dioxide-type substrates, the developed substrates may then be treated with a buffered, hydrofluoric acid etching solution or plasma gas etch. The resist compositions of the present invention are believed to be resistant to a wide variety of acid etching solutions or plasma gases and provide effective protection for the resist-coated areas of the substrate.

Later, the remaining areas of the photoresist coating may be removed from the etched substrate surface by conventional photoresist stripping operations.

The present invention is further described in detail by means of the following Examples. All parts and percentages are by weight unless explicitly stated otherwise.

EXAMPLES 1-5

Novolak Preparation

The following general procedure was used to prepare five novolak resins which are described in detail in Tables I and II below.

The phenolic monomers indicated in Table I, formaldehyde and oxalic acid dihydrate catalyst, were placed in a 4-neck glass flask equipped with mechanical agitation, condenser, electric heating mantle thermometer, and temperature control (thermowatch) unit. Each reaction mixture was heated to reflux (95°-100° C.). Each reaction was allowed to proceed for 12-19 hours at reflux temperature. The unreacted formaldehyde and water were removed by atmospheric distillation under a mild flow of nitrogen at temperatures between 100° C. and 170° C. This was followed by vacuum distillation started at 170°-200° C. and continued to 230°-265° C. During the vacuum distillation, the remaining unreacted m-cresol and 5-indanol were removed. The pure molten novolak was poured out of the flask into an aluminum tray under a nitrogen atmosphere at 180° C.

TABLE I

Novalak Reaction Conditions

| Novolak | 5-Indanol | m-Cresol | Formaldehyde 37% | CH2O/Phenolic Molar Ratio | Oxalic Acid Added |
|---|---|---|---|---|---|
| 1 | 100 gm | 00 | 45.4 gm | | |
| | 0.746 Mole | 00 | 0.5595 Mole | 0.75 | 1.0 gm |
| 2 | 100.5 gm | 55.5 gm | 71 gm | | |
| | 0.75 Mole | 0.514 Mole | 0.876 Mole | 0.693 | 1.5 gm |
| 3 | 62 gm | 200 gm | 131.3 gm | | |
| | 0.463 Mole | 1.85 Mole | 1.62 Mole | 0.70 | 1.5 gm |
| 4 | 50.4 gm | 94.8 gm | 76.2 gm | | |
| | 0.376 Mole | 0.877 Mole | 0.94 Mole | 0.75 | 1.5 gm |

TABLE II

Novalak Composition, Yield, and Properties

| Novalak | 5-Indanol % | m-Cresol % | CH2O/Phenolic | Yield | $T_c$ | SP (°C.) |
|---|---|---|---|---|---|---|
| 1 | 100 | 0 | 0.75 | 78.8 | — | 146 |
| 2 | 59.3 | 40.7 | 0.693 | 70.4 | 4200 | 124 |
| 3 | 20.0 | 80.0 | 0.70 | 77.3 | 5 | 125 |
| 4 | 40.0 | 60.0 | 0.70 | 78.6 | 125 | 125 |
| 5 | 30.0 | 70.0 | 0.75 | 78.4 | 29 | 140 |

Yield = Percent of product by weight based on total phenolics conversion.
SP = Softening point measured by ball and ring method, ASTM No. 06.03.
$T_c$ = The time, in seconds, required to completely dissolve one micron coating of novalak resin using an 0.265N developer solution of TMAH (aqueous)*. The coatings are prepared by spin coating novalak solutions on 2-inch silicon wafers and baking them in a convection oven at 100° C. for 30 mins. The measurement of $T_c$ is carried out during development using laser interferometry technique according to general teachings described in Grindle and Pavelcheck, Test and Measurement World, May, 1986, pages 102 et seq.. *This developer is commercially available from OCG known as OPRD-262 developer.

EXAMPLES 6-11

Resist Formulations

Six resist formulations were prepared by dissolving the novolaks of either Examples 2 or 4, or both, a photo active compound (PAC), a speed enhancer (SE), and 0.07% by weight of a leveling agent (TROYKYD 366 made by Troy Chemical Co. of Schenectady, NY in a solvent mixture of 70% by weight ethyl lactate and 30% by weight ethyl-3-ethoxy propionate. The PAC used in all six formulations was prepared by reacting six moles of 1,2-naphthoquinonediazide-5-sulfonlychloride with a one mole of a trimer phenolic compound. The trimer was produced by condensing two moles of pyrogallol with one mole of 2,6-bis(hydroxymethyl)paracresol. The amount of PAC in all resist formulations was 18% by weight in the total solids. The speed enhancer (SE) used in some of these formulations is a compound known commercially as TRISP-PA purchased from Honshu Chemical Ind. Co., Ltd., Japan. The amount of SE is calculated by weight percent of the novolak plus SE added weight.

Table III describes the different formulations of the resist examples. Table IV describes certain properties of these resists.

TABLE III

Resist Formulation Examples

| Resist | Novolak Example | Blend Ratio | Novolak Blend $T_c$ | % SE |
|---|---|---|---|---|
| 6 | 4 | — | 125 | 0 |
| 7 | 2:4 | 1:1 | 650 | 0 |
| 8 | 2:4 | 1:1 | 650 | 8.4 |
| 9 | 2:4 | 1:1 | 650 | 17.7 |
| 10 | 2:4 | 2:1 | 1500 | 19.3 |
| 11 | 2 | — | 4200 | 20.0 |

TABLE IV

| Resist | Photospeed (mJ/cm$^2$) | Line/Space Resolution (μm) | Contrast (Tan Θ) |
|---|---|---|---|
| 6 | 143 | 0.55 | 2.15 |
| 7 | 428 | 0.50 | 2.3 |
| 8 | 192 | 0.55 | 2.29 |
| 9 | 86 | 0.65 | 1.67 |
| 10 | 113 | 0.62 | 1.79 |
| 11 | 150 | 0.65 | 1.67 |

Contrast = (Tan Θ) slope of curve relating log exposure and log dissolution rate.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. The process for forming positive resist patterns on a substrate comprising:
   (1) coating said substrate with a radiation-sensitive composition useful as a positive working photoresist, said composition comprising an admixture of o-quinonediazide compound and a binder resin comprising a condensation product of at least one aldehyde source with a phenolic source comprising 5-indanol and at least one unit of a phenolic monomer selected from the group consisting of phenol, cresols, xylenols, and trimethylphenols; the amount of said o-quinonediazide compound being about 5% to about 40% by weight and the amount of said binder resin being about 60 to 95% by weight, based on the total solids content of said radiation-sensitive composition;
   (2) subjecting said coating on said substrate to an image-wise exposure of radiant energy; and
   (3) subjecting said image-wise exposed coated substrate to a developing solution wherein the exposed areas of said radiation-exposed coating are dissolved and removed from the substrate, thereby resulting in positive image-wise pattern in the coating.

2. The process of claim 1 wherein said phenolic monomer comprises units of meta-cresol, para-cresol, and mixtures thereof.

3. The process of claim 1 wherein said radiant energy is ultraviolet light.

4. The process of claim 1 wherein said developing solution comprises an aqueous solution of an alkali metal hydroxide or silicates or an aqueous solution of tetramethylammonium hydroxide.

* * * * *